(12) United States Patent
Lee et al.

(10) Patent No.: US 7,037,827 B2
(45) Date of Patent: May 2, 2006

(54) SEMICONDUCTOR DEVICE WITH EPITAXIAL C49-TITANIUM SILICIDE (TISI2) LAYER AND METHOD FOR FABRICATING THE SAME

(75) Inventors: Moon-Keun Lee, Ichon-shi (KR); Tae-Kwon Lee, Ichon-shi (KR); Jun-Mo Yang, Ichon-shi (KR); Tae-Su Park, Ichon-shi (KR); Yoon-Jik Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 117 days.

(21) Appl. No.: 10/749,878

(22) Filed: Dec. 30, 2003

(65) Prior Publication Data

US 2004/0180543 A1 Sep. 16, 2004

(30) Foreign Application Priority Data

Feb. 21, 2003 (KR) ...................... 10-2003-0011101

(51) Int. Cl.
*H01L 21/4763* (2006.01)
(52) U.S. Cl. ...................................... 438/649; 438/648
(58) Field of Classification Search ................ 438/597, 438/648, 649, 682
See application file for complete search history.

(56) References Cited

U.S. PATENT DOCUMENTS 5,731,226 A   3/1998  Lin et al.
6,019,839 A   2/2000  Achutharaman et al.
2002/0171107 A1*  11/2002  Cheng et al. ................ 257/347

FOREIGN PATENT DOCUMENTS

| JP | 2000297998 A | 10/2001 |
| KR | 1997-0052925 | 7/1997 |
| KR | 1020020003001 | 1/2002 |

OTHER PUBLICATIONS

"Epitaxial Growth of TiSi2 (C49) on (001) Si by Rapid Thermal Annealing" LiMing Wang et al., Oct. 1997, Jpn. J. Appl. Phys. vol. 36 pp. 6475-6480.*

* cited by examiner

*Primary Examiner*—Bradley K. Smith
(74) *Attorney, Agent, or Firm*—Blakely Sokoloff; Taylor & Zafman

(57) ABSTRACT

A semiconductor device with an epitaxially grown titanium silicide layer having a phase of C49 and a method for fabricating the same. The titanium silicide layer has a predetermined interfacial energy that does not transform the phase of the titanium layer, and thus, occurrences of agglomeration of the titanium layer and a grooving phenomenon can be prevented. The semiconductor device includes: a silicon layer; an insulation layer formed on the silicon layer, wherein a partial portion of the insulation layer is opened to form a contact hole exposing a partial portion of the silicon layer. An epitaxially grown titanium silicide layer having a phase of C49 and is formed on the exposed silicon substrate disposed within the contact hole; and a metal layer is formed on an upper surface of the titanium silicide layer.

14 Claims, 21 Drawing Sheets

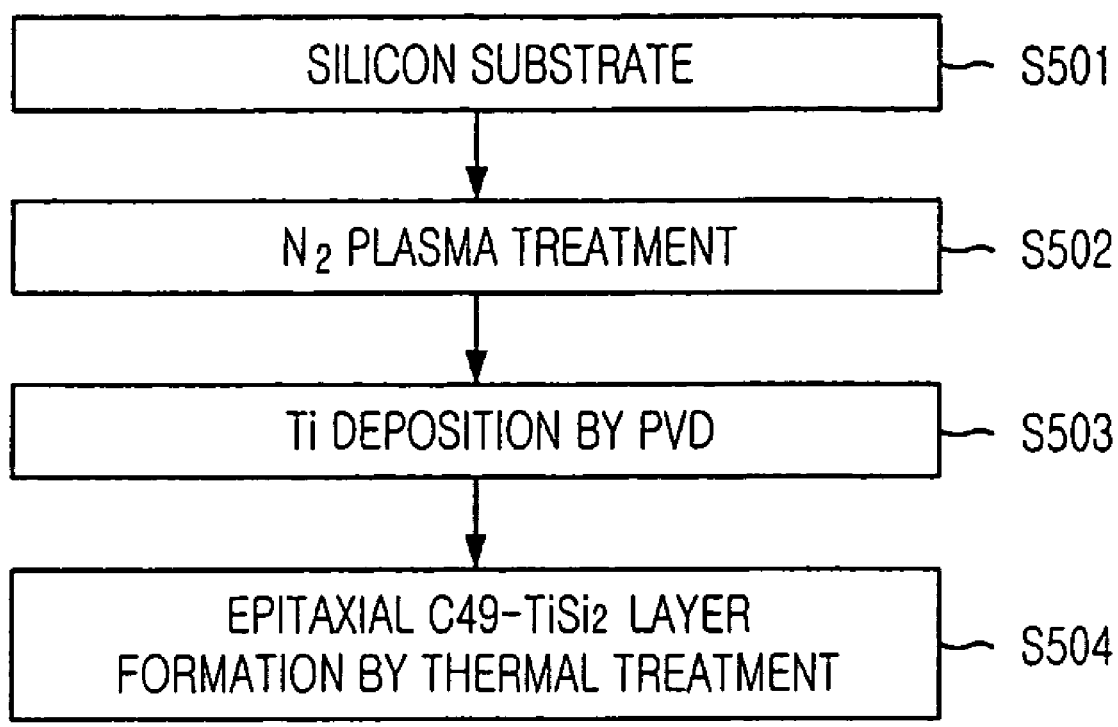

SEMICONDUCTOR DEVICE WITH EPITAXIAL C49-TITANIUM SILICIDE (TISI2) LAYER AND METHOD FOR FABRICATING THE SAME

FIELD OF THE INVENTION

The present invention relates to a semiconductor device and a method for fabricating the same; and, more particularly, to a semiconductor device with an epitaxially grown titanium silicide ($TiSi_2$) layer having a C49 phase and a method for fabricating the same.

DESCRIPTION OF RELATED ARTS

Generally, a bit line or a capacitor is formed with metal to improve performance of a semiconductor device. At this time, a titanium silicide ($TiSi_2$) layer is formed in a contact region between a silicon substrate and the metal or between a silicon layer and the metal to reduce a contact resistance.

The $TiSi_2$ layer formed by the conventional method has a polycrystalline structure, and a subsequent high temperature process such as a boron-phosphorus-silicate glass (BPSG) flow process or a capacitor formation process makes the phase of the $TiSi_2$ layer transform from C49 to C59. This phase transformation results in agglomeration and grooving phenomena, which consequently deteriorate device characteristics, e.g., an incidence of leakage current. Hereinafter, the $TiSi_2$ layer having the C49 phase is referred to as a C49-$TiSi_2$ layer, while the TiSi2 layer having the C54 phase is referred to as a C54-$TiSi_2$ layer. FIG. 1A is a cross-sectional view showing a conventional semiconductor device having a $TiSi_2$ layer, and FIG. 1B is a flowchart showing related processes for fabricating the conventional semiconductor device having the $TiSi_2$ layer.

Referring to FIGS. 1A and 1B, a silicon substrate or silicon layer 101 in which predetermined processes are completed is formed at Step S101. Then, titanium (Ti) is deposited on the silicon substrate 101 through a physical vapor deposition (PVD) technique at Step S102.

Next, at Step S103, a rapid thermal process (RTP) performed in an atmosphere of nitrogen ($N_2$) causes the deposited Ti to be silicidated from an interfacial surface with the silicon substrate 101 to form a $TiSi_2$ layer 102. Simultaneously, a titanium nitride (TiN) layer 103 is formed on a surface side of the deposited Ti. At Step S104, a metal layer 103 made of aluminum (Al) or tungsten (W) is formed on the TiN layer 103. Herein, the metal layer 103 is for a bit line, a capacitor, a storage node, an interconnection wire, or a contact plug.

At this time, the RTP is performed in one step or two steps. Particularly, the $TiSi_2$ layer 102 has the phase of C49 or C54 depending on a process temperature of the RTP and a thickness of the deposited Ti. Even if the C49-$TiSi_2$ layer is formed during the deposition of the Ti, it is transformed into the thermodynamically stable C54-$TiSi_2$ layer during a subsequent high temperature process. A BPSG flow or a capacitor thermal treatment is an example of the subsequent high temperature process.

However, the C54-$TiSi_2$ layer has a higher interfacial energy with the silicon substrate than that of the C49-$TiSi_2$ layer, and thus, the $TiSi_2$ layer having the C54 phase is agglomerated due to generation of new nuclei and grain growth during the subsequent high temperature process. As a result, a contact resistance and leakage currents may be increased.

Also, in the C54-$TiSi_2$ layer, a grooving phenomenon that causes the grain size to be decreased occurs in order to reduce thermodynamic energy. Because of this grooving phenomenon, the thickness of the C54-$TiSi_2$ layer becomes more inconsistent, thereby increasing roughness of the $TiSi_2$ layer. Therefore, the grooving phenomenon becomes a factor for increasing a contact resistance and leakage currents.

Accordingly, in order to maintain low contact resistance of the contact between the $TiSi_2$ layer and the silicon substrate, it is important to form the thermodynamically stable $TiSi_2$ layer so that additional phase transformation of the $TiSi_2$ layer and agglomeration do not occur during the subsequent high temperature process. Forming such $TiSi_2$ layer having low interfacial energy with the silicon substrate may be the only method for achieving those effects.

SUMMARY OF THE INVENTION

It is, therefore, an object of the present invention to provide a semiconductor device capable of preventing agglomeration and grooving of a titanium silicide ($TiSi_2$) layer by epitaxially growing the $TiSi_2$ layer having a C49 phase and low interfacial energy that does not result in a phase transformation of the $TiSi_2$ layer during a high temperature process and to provide a method for fabricating the same.

It is therefore another object of the present invention to provide a semiconductor device with an epitaxially grown TiSi2 layer having a C49 phase and low interfacial energy to thereby reduce leakage currents and a contact resistance and a method for fabricating the same.

In accordance with an aspect of the present invention, there is provided a semiconductor device, including: a silicon layer; an insulation layer formed on the silicon layer, wherein a partial portion of the insulation layer is opened to form a contact hole exposing a partial portion of the silicon layer; an epitaxially grown titanium silicide layer having a phase of C49 and formed on the exposed silicon substrate disposed within the contact hole; and a metal layer formed on an upper surface of the titanium silicide layer.

In accordance with another aspect of the present invention, there is also provided a semiconductor device, including: a silicon substrate; a device isolation layer locally formed in the silicon substrate and defining a field region and an active region; a metal-oxide semiconductor (MOS) transistor formed in the active region of the silicon substrate and including a gate electrode and source/drain diffusion regions; and a titanium silicide layer having a phase of C49 and being epitaxially grown on a surface of the silicon substrate disposed above each source/drain diffusion region.

In accordance with still another aspect of the present invention, there is also provided a method for fabricating a semiconductor device, including the steps of: providing a silicon substrate in which predetermined processes are completed; performing a plasma treatment to a surface of the silicon substrate in a gaseous atmosphere including nitrogen; depositing a titanium layer on the silicon substrate by employing a physical vapor deposition (PVD) technique; and getting the silicon substrate react with the deposited titanium layer through the use of a thermal treatment to form an epitaxially grown titanium silicide layer having a phase of C49.

In accordance with still another aspect of the present invention, there is also provided a method for fabricating a semiconductor device, including the steps of: forming a device isolation layer for defining a field region and an active region in a silicon substrate; forming a transistor including source/drain diffusion regions in the active region of the silicon substrate; performing a plasma treatment to the silicon substrate disposed above each source/drain region in a gaseous atmosphere including nitrogen; depositing a titanium layer on the silicon substrate by employing a PVD technique; getting the silicon substrate to react with the deposited titanium layer through the use of a thermal treatment to form an epitaxially grown titanium silicide layer having a phase of C49; and removing the non-reacted titanium layer.

In accordance with still another aspect of the present invention, there is also provided a method for fabricating a semiconductor device, including the steps of: providing a silicon substrate in which predetermined processes are completed; and flowing a source gas of Ti and a reduction gas to epitaxially grow a titanium silicide layer having a phase of C49 by using a chemical vapor deposition (CVD) technique using a surface reaction with the silicon substrate and a vapor reaction.

In accordance with a further aspect of the present invention, there is also provided a method for fabricating a semiconductor device, including the steps of: (a) loading a silicon substrate to which predetermined processes are completed in a chamber for an atomic layer deposition (ALD) technique; (b) flowing a source gas of titanium into the chamber; (c) purging the non-reacted source gas of titanium from the chamber; (d) flowing a reduction gas into the chamber; (e) purging the reaction gas from the chamber; and (f) repeating the steps (a) to (e) several times to form an epitaxially grown titanium silicide layer having a phase of C49 by employing the ALD technique.

BRIEF DESCRIPTION OF THE DRAWING(S)

The above and other objects and features of the present invention will become apparent from the following description of the preferred embodiments given in conjunction with the accompanying drawings, in which:

FIG. 5 is a flowchart showing steps of forming the epitaxially grown C49-$TiSi_2$ layer formed by the PVD technique in accordance with the present invention;

DETAILED DESCRIPTION OF THE INVENTION

Hereinafter, a method for forming an epitaxially grown titanium silicide ($TiSi_2$) layer having a C49 phase (hereinafter referred to as a C49-$TiSi_2$ layer) on a silicon substrate or a silicon layer will be explained in detail with reference to the accompanying drawings.

Figure 1A:
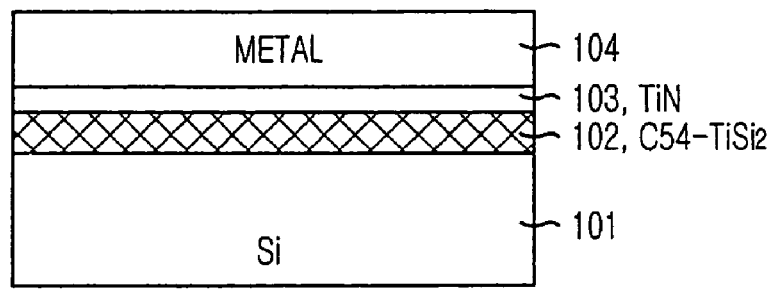
FIG. 1A is a cross-sectional view showing a conventional semiconductor device having a titanium silicide ($TiSi_2$) layer.
Figure 1B:
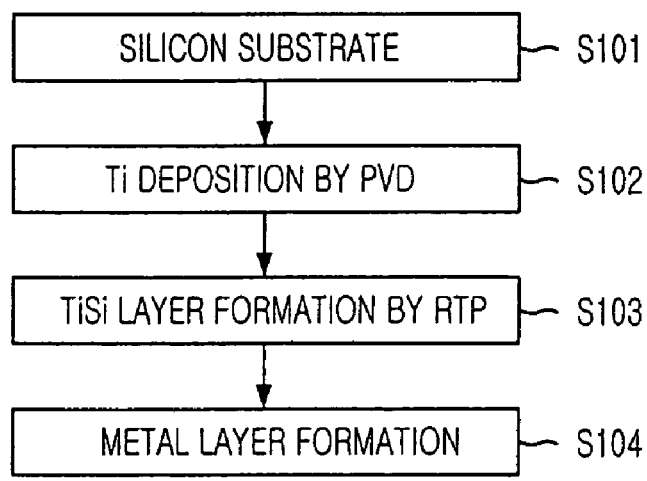
FIG. 1B is a flowchart showing relevant processes for fabricating the conventional semiconductor device having the $TiSi_2$ layer.
Figure 2A:
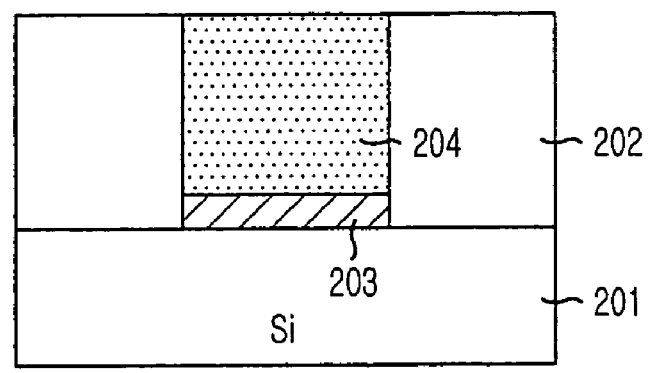
FIG. 2A shows a contact structure of a semiconductor device having an epitaxially grown $TiSi_2$ layer having a phase of C49 (hereinafter referred to as a C49-$TiSi_2$ layer) in accordance with the present invention.

FIG. 2A shows a contact structure of a semiconductor device, wherein a metal layer 204 contacts a silicon substrate 201 through a contact hole formed by opening an insulation layer 202. In such a semiconductor device a dynamic random access memory (DRAM) device, a bit line contact, a storage node contact of a capacitor, an interconnection wire contact and a contact plug formations correspond to the above case.

Referring to FIG. 2A, the insulation layer 202 is opened until a surface of the silicon substrate or a single crystalline silicon layer 201 is exposed so to form a contact hole. Then, an epitaxially grown C49-$TiSi_2$ layer 203 is formed on the exposed surface of the silicon substrate 201, and the metal layer 204 is formed on top of the epitaxially grown C49-$TiSi_2$ layer 203. The metal layer 204 can be made of aluminum or tungsten and can include a barrier metal layer such as a TiN layer formed at an interfacial surface between the metal layer 204 and the epitaxially grown C49-$TiSi_2$ layer 203 to prevent diffusion of atoms between the silicon substrate 201 and the metal layer 204.

Figure 2B:
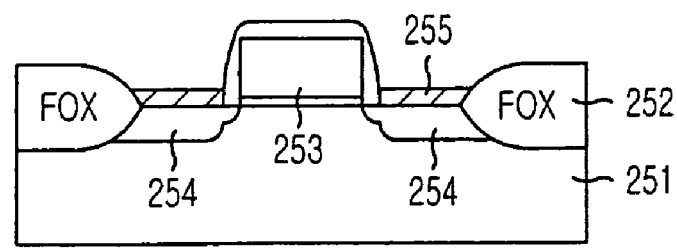
FIG. 2B shows a metal oxide semiconductor (MOS) transistor structure of a semiconductor device with an epitaxially grown C49-$TiSi_2$ layer in accordance with the present invention.

FIG. 2B shows a metal oxide semiconductor (MOS) transistor of a semiconductor device having a C49-$TiSi_2$ layer formed as a self-aligned silicide layer (hereinafter shortly abbreviated as a salicide layer). A field oxide layer 252 defines a field region and an active region in a silicon substrate 251, and the MOS transistor constituted with a gate 253 and source/drain diffusion regions 254 in the active region of the silicon substrate 251 is formed. The epitaxially grown C49-TiSi$_2$ layer 255 is formed on a surface of the silicon substrate 251 corresponding to the source/drain diffusion region 254.

In both structures shown in FIGS. 2A and 2B, each epitaxially grown C49-TiSi$_2$ layer denoted as 203 or 255 has a (060) plane, and thus, a lattice constant of the (060) plane of the C49-TiSi$_2$ layer 203 or 255 is very close to that of the (100) plane of silicon. Hence, if the (060) plane of the C49-TiSi$_2$ layer 203 or 255 is formed on the (100) plane of the silicon substrate 201 or 251, an energetically stable semi-matched epitaxial growth is possible.

The above epitaxially grown C49-TiSi$_2$ layer 203 or 255 forms a semi-matched interface with the silicon substrate 201 or 251 and generates a misfit dislocation so to minimize transformational energy at the interface between the silicon substrate 201 or 251 and the C49-TiSi$_2$ layer 203 or 255. When the phase of the TiSi$_2$ layer 201 or 255 transforms from C49 to C54, a nucleus found in the C54 phase is typically formed around a high energy region of a grain boundary. However, the epitaxially grown TiSi$_2$ layer 203 or 255 does not have the grain boundary but forms an interface with the silicon substrate 201 or 251. Since the interface between the silicon substrate 201 or 251 and the C49-TiSi$_2$ layer 203 or 255 has a minimum energy level by being formed in a semi-matched state, the nuclei generation in the phase of C54 hardly occurs compared to a C49-TiSi$_2$ layer with polycrystalline structure. Therefore, those problems such as a phase transformation from C49 to C54, generation and growth of nuclei of the C54-TiSi$_2$ layer, agglomeration of the TiSi$_2$ layer and a grooving phenomenon do not arise. Eventually, it is possible to improve contact resistance between the silicon substrate 201 and the C49-TiSi$_2$ layer 203 or 255 and reduce leakage currents.

Hereinafter, the method for forming the epitaxially grown C49-TiSi$_2$ layer will be described in more detail. Also, there are provided descriptions of various applications of the C49-TiSi$_2$ layer to a semiconductor memory device such as a dynamic random access memory (DRAM).

According to the present invention, the method for forming the C49-TiSi$_2$ layer can proceed by employing a physical vapor deposition (PVD) technique, a chemical vapor deposition (CVD) technique and an atomic layer deposition (ALD) technique.

FIGS. 3A to 3E are cross-sectional views demonstrating a MOS transistor structure of a semiconductor device with the epitaxially grown C49-TiSi$_2$ layer formed by employing the PVD technique during a salicide process in accordance with the present invention.

Figure 3A:
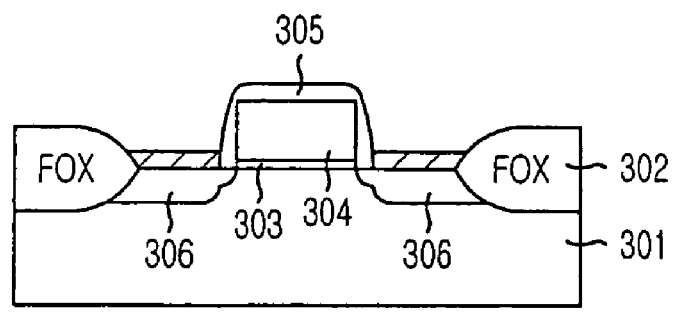
FIGS. 3A to 3E are cross-sectional views demonstrating a MOS transistor structure of a semiconductor device with an epitaxially grown C49-$TiSi_2$ layer formed by employing a physical vapor deposition (PVD) technique during a salicide process in accordance with the present invention.

Referring to FIG. 3A, field oxide layers 302 are formed in a silicon substrate 301 to define a field region and an active region. In the active region of the silicon substrate 301, a typical MOS transistor including a gate insulation layer 303, a gate electrode 304, an insulation layer 305 covering an upper surface and lateral sides of the gate electrode 304 and source/drain regions 306 is formed.

Figure 3B:
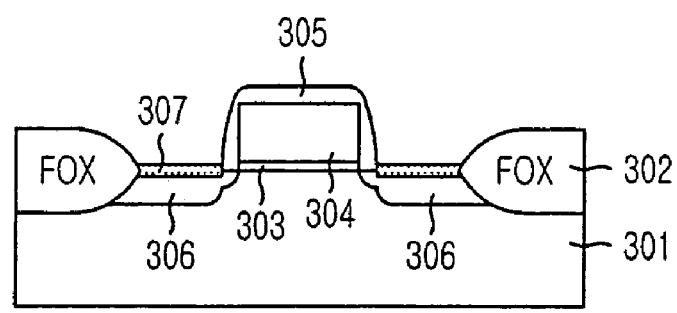

Referring to FIG. 3B, a surface of the silicon substrate 301 corresponding to each the source/drain diffusion region 306 is cleaned through a wet cleaning process using buffered oxide etchant (BOE) or hydrofluoric acid (HF) or through a dry cleaning process using a base like nitrogen trifluoride (NF$_3$). Thereafter, an nitrogen (N$_2$) trapped layer 307 is formed on a surface of the silicon substrate 301 allocated above the source/drain diffusion regions 306 through an N$_2$ plasma or ammonium (NH$_3$) plasma treatment carried out at a temperature ranging from about 400° C. to about 450° C., a pressure ranging from about 3 Torr to about 5 Torr and a power ranging from about 400 W to about 500 W for about 30 seconds to 60 seconds. The N$_2$ trapped layer 307 is formed by nitrogen ions that penetrate into vacancy sites of the silicon lattice and are trapped therein. As a reference, silicon has a cubic structure like diamond, and the vacancy exists at points of 0, ¾ and ¼.

Figure 3C:
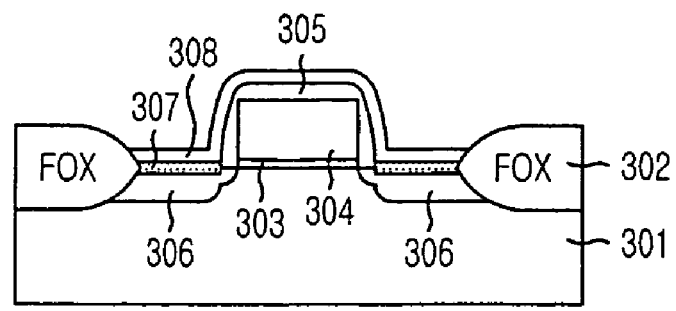

Referring to FIG. 3C, a titanium (Ti) layer 308 is deposited on an entire surface of the above constructed structure by employing an ion metal plasma (IMP) technique, which is a type of PVD technique. At this time, the titanium layer 308 has a thickness ranging from about 50 Å to about 300 Å.

Figure 3D:
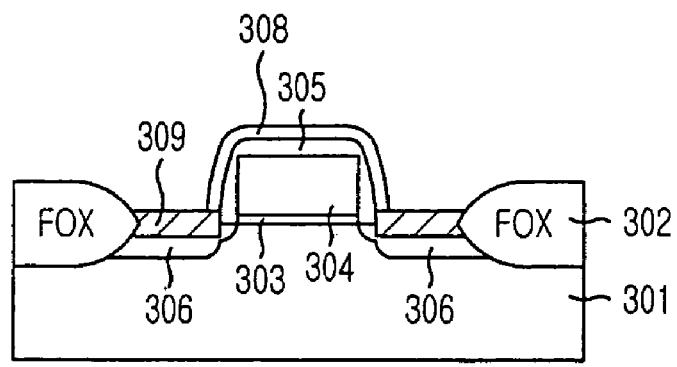

Referring to FIG. 3D, a rapid thermal process (RTP) for silicidation is performed to form an epitaxially grown C49-TiSi$_2$ layer 309. The RTP can be performed in one step or two steps. If the RTP proceeds in two steps, the first step is carried out at a temperature ranging from about 670° C. to about 850° C. for about 20 seconds to about 30 seconds, while the second step is carried out at a temperature ranging from about 850° C. to about 900° C. for about 20 seconds to about 30 seconds.

Figure 3E:
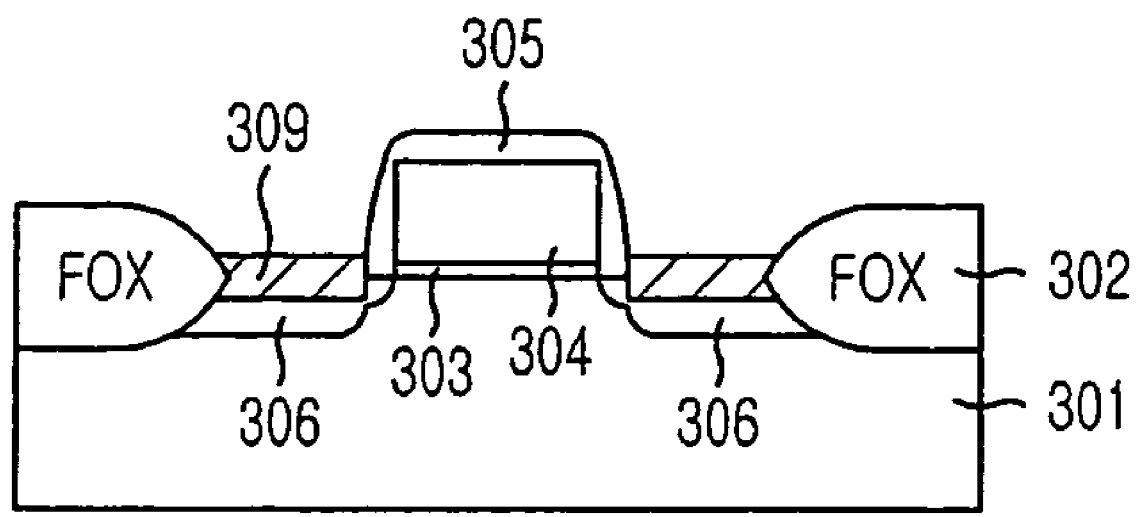

In this preferred embodiment of the present invention, the silicidation is carried out after the formation of the nitrogen trapped layer 307. Thus, the nitrogen trapped layer 307 prevents diffusions of silicon and titanium to slow down the rate of silicide formation. That is, an unstable silicon nitride (SiN$_x$) layer formed by adsorbing nitrogen onto the silicon substrate 301 during the nitrogen plasma treatment or an unstable titanium nitride (TiN$_x$) layer formed by a reaction between titanium and nitrogen during the titanium deposition suppresses reciprocal diffusions between the silicon and the titanium. This impeded reciprocal diffusion further suppresses the silicide reaction. As a result, the silicidation takes place slowly at the silicon substrate 301, particularly at the source/drain diffusion regions 306, and thereby reaching energetically the most stable epitaxial growth during the silicidation. Thereafter, as shown in FIG. 3E, the non-reacted titanium layer 308 is removed to thereby complete the formation of the MOS transistor with the application of the salicide process.

FIGS. 4A to 4E are cross-sectional views showing a contact structure of a semiconductor device providing an epitaxially grown C49-TiSi$_2$ layer formed by the PVD technique during a metal contact process in accordance with the present invention.

Figure 4A:
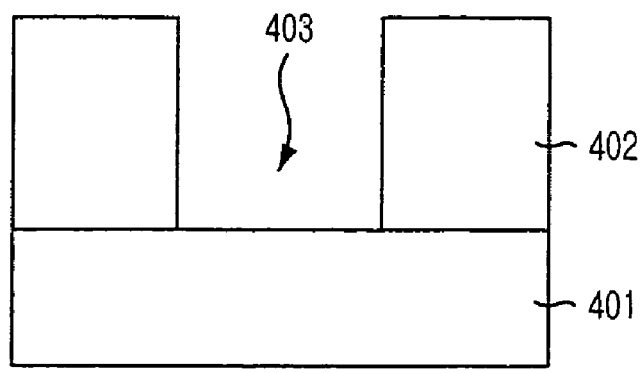
FIGS. 4A to 4E are cross-sectional views showing a contact structure of a semiconductor device with an epitaxially grown C49-$TiSi_2$ layer formed by employing a PVD technique during a contact process in accordance with the present invention.

Referring to FIG. 4A, an insulation layer 402 formed on a silicon substrate or a silicon layer 401 is etched to form a contact hole 403 exposing a partial surface of the silicon substrate 401. The insulation layer 402 can be a single layer or stacked layers.

Figure 4B:
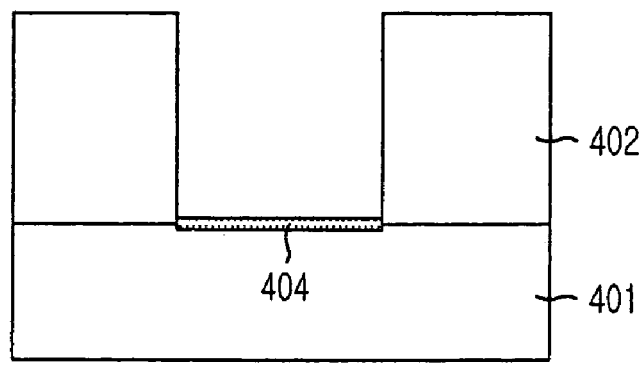

Referring to FIG. 4B, the exposed surface of the silicon substrate 401 is cleaned through a wet cleaning process using BOE or HF or a dry cleaning process using NF3. Then, a nitrogen trapped layer 404 is formed on the exposed surface of the silicon substrate 401 through a N$_2$ plasma or NH$_3$ plasma treatment carried out by using a power ranging from about 400 W to about 500 W for about 30 seconds to about 60 seconds.

Figure 4C:
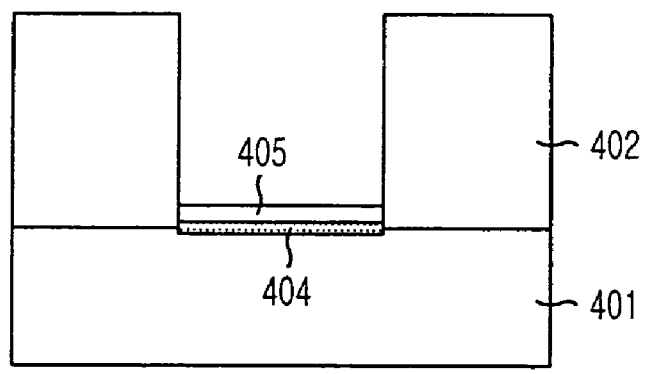

Referring to FIG. 4C, a titanium layer 405 is formed on the nitrogen trapped layer 404 by using an IMP technique, which is a type of PVD technique. At this time, the titanium layer 405 has a thickness ranging from about 50 Å to about 300 Å.

Figure 4D:
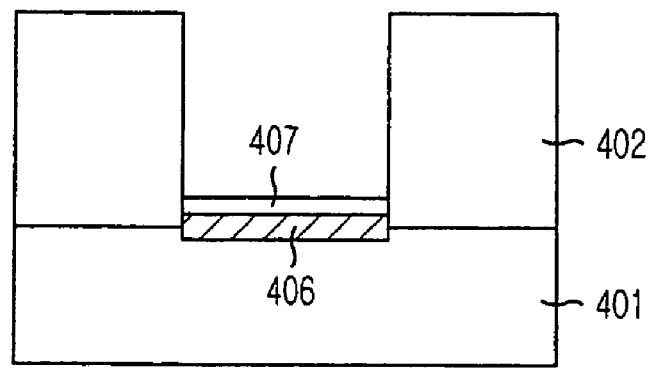

As shown in FIG. 4D, a RTP is then performed to the above resulting structure in an atmosphere of nitrogen. After the RTP, an epitaxially grown C49-TiSi$_2$ layer 406 is formed by silicidation at an interface with the silicon substrate 401, while a titanium nitride (TiN) layer 407 is formed from a surface of the titanium layer 405. The titanium nitride layer 407 functions as a barrier layer for suppressing/preventing reciprocal diffusions of atoms between a metal layer 408 which will be deposited on the titanium nitride layer 407 and the silicon substrate 401.

Herein, the RTP can be performed in one step or two steps. In case of performing in two steps, the first step is carried out at a temperature ranging from about 670° C. to about 850° C. for about 20 seconds to about 30 seconds, while the second step is carried out at a temperature ranging from about 850° C. to about 900° C. for about 20 seconds to about 30 seconds.

Figure 4E:
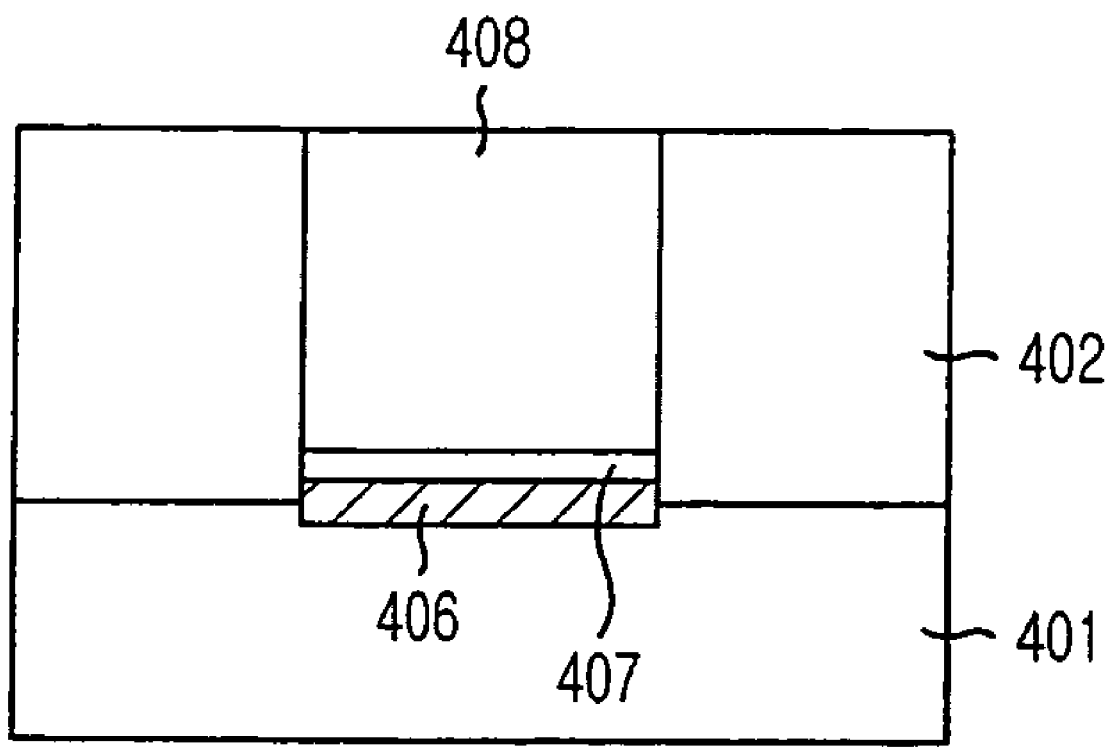

Next, as shown in FIG. 4E, the metal layer 408 is filled into the contact hole 403. The metal layer 408 can be a bit line, an electrode of a capacitor, a plug or an interconnection wire.

In the preferred embodiment of the present invention described in FIGS. 4A to 4E, the silicidation proceeds after the titanium layer is formed through the use of the PVD technique subsequent to the formation of the nitrogen trapped layer. Thus, diffusions of silicon and titanium can be suppressed, and thus, the silicidation takes place slowly. As a result of this slower silicidation, it is possible to form energetically the most stable epitaxially grown C49-TiSi$_2$ layer during the silicidation. In addition, the barrier metal layer, which is the titanium nitride layer, can also be formed during the silicidation by the RTP.

FIG. 5 is a flowchart showing steps of forming the epitaxially grown C49-TiSi$_2$ layer by employing the PVD technique in accordance with the present invention.

As shown, the epitaxially grown C49-TiSi$_2$ layer formation process with the use of the PVD technique includes the steps as follows. At Step S501, a silicon substrate or a silicon layer in which predetermined processes are completed is prepared. At Step S502, a surface of the silicon substrate is applied with a plasma treatment in a gaseous atmosphere including nitrogen gas. At Step S503, titanium is deposited on the silicon substrate treated with nitrogen plasma through the use of the PVD technique. Lastly, at Step S504, a thermal process is performed to form the epitaxially grown C49-TiSi$_2$ layer. Herein, the preferred embodiments of the present invention show the use of RTP as the thermal process. However, it is still possible to perform a furnace annealing as the thermal process instead of the RTP. The formation of the barrier metal, e.g., the TiN layer, is dependent on whether or not the atmosphere of nitrogen is maintained.

FIGS. 6 to 9 show analytical data of a sample providing the epitaxially grown C49-TiSi$_2$ layer formed by using the PVD technique according to the present invention. Especially, the S sample is prepared by a series of processes. First, a surface of a silicon substrate positioned at a (001) plane is cleaned to remove a native oxide layer. Then, the surface of the silicon substrate is treated with N$_2$ plasma under a radio frequency (RF) voltage of about 410 W, so that the nitrogen (N$_2$) ions are adsorbed onto the surface of the silicon substrate. Thereafter, titanium (Ti) is deposited to a thickness of about 20 nm through the use of IMP. A RTP is performed in an atmosphere of nitrogen at a temperature ranging from about 670° C. to about 850° C. for about 20 seconds to form silicide.

Figure 6:
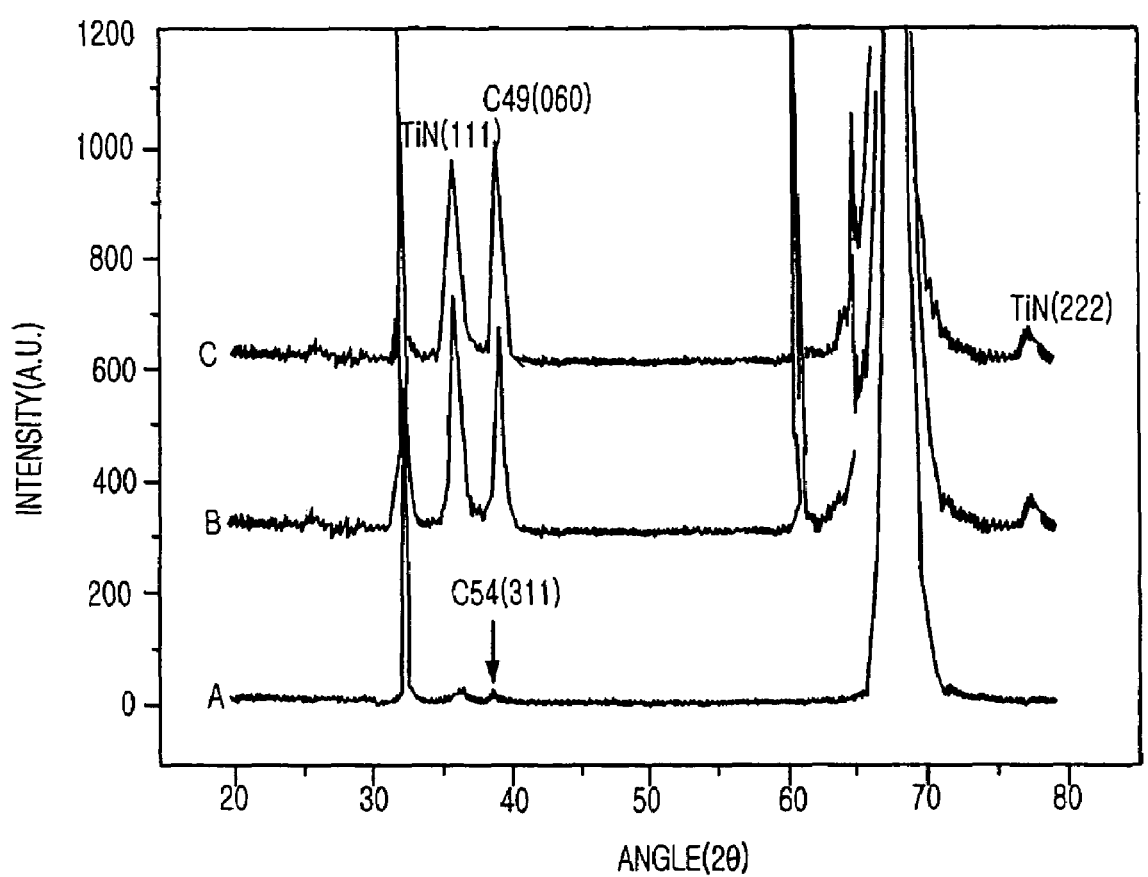
FIG. 6 is a graph showing an X-ray diffractometric (XRD) analysis with respect to cases of performing the $N_2$ plasma treatment for about 30 seconds and for about 60 seconds prior to depositing the Ti layer and of not performing the $N_2$ plasma treatment.

More specifically, FIG. 6 is a graph showing an X-ray diffractometric (XRD) analysis with respect to cases of performing the N$_2$ plasma treatment for about 30 seconds and for about 60 seconds prior to depositing the Ti layer and of not performing the N$_2$ plasma treatment. Herein, the first cases of performing the N$_2$ plasma treatment for about 30 seconds and for about 60 seconds are denoted as B and C, respectively. The case of not performing the N$_2$ plasma treatment is denoted as A. As shown, for the case A, there are observed peaks of titanium nitride (TiN) and a (311) plane of the C54-TiSi$_2$ layer. However, for the cases B and C, there are observed peaks of a (111) plane of TiN and a (060) plane of the C49-TiSi$_2$ layer. This result shows that the nitrogen plasma treatment changes the state of the silicon substrate surface, which affects the phase of the TiSi$_2$ layer and phase transformation of the TiSi$_2$ layer.

Figure 7A:
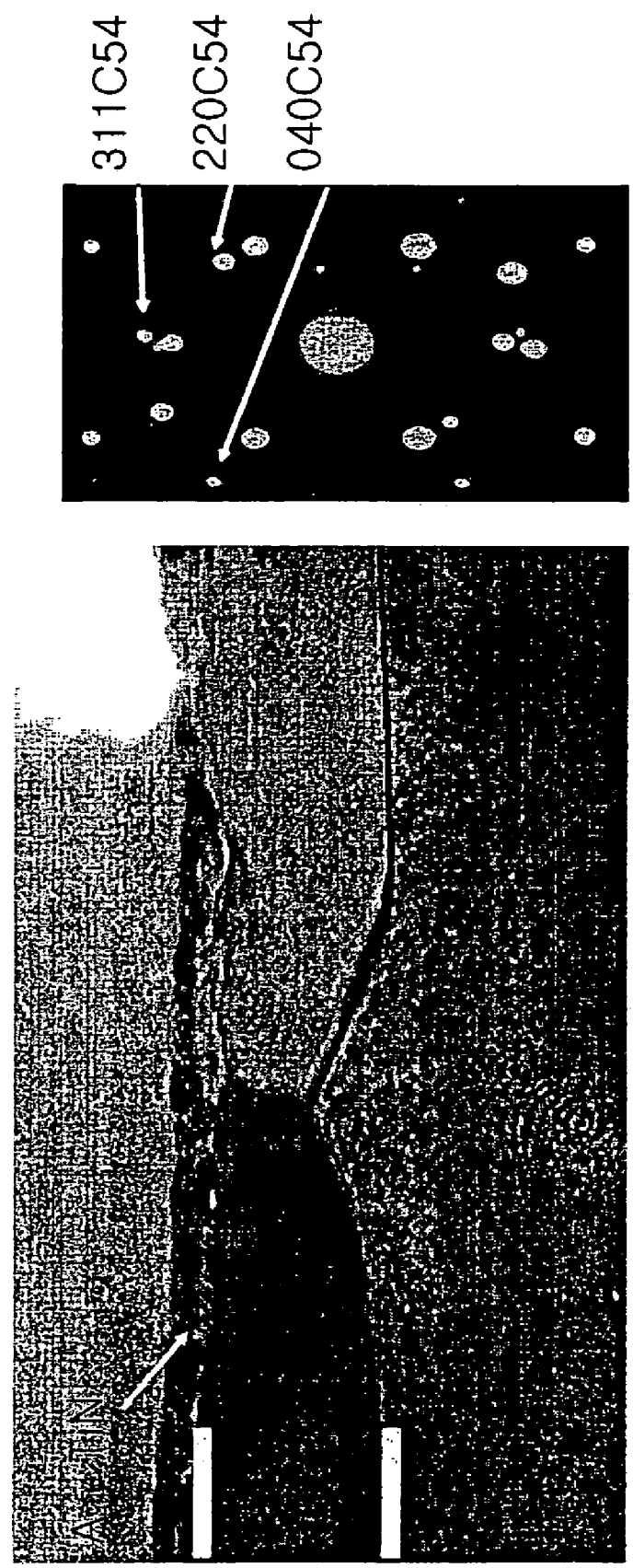
FIG. 7A is a transmission electron microscopy (TEM) micrograph showing a fine structure of the phase of the $TiSi_2$ layer included in a sample to which the $N_2$ plasma treatment is not applied.
Figure 7B:
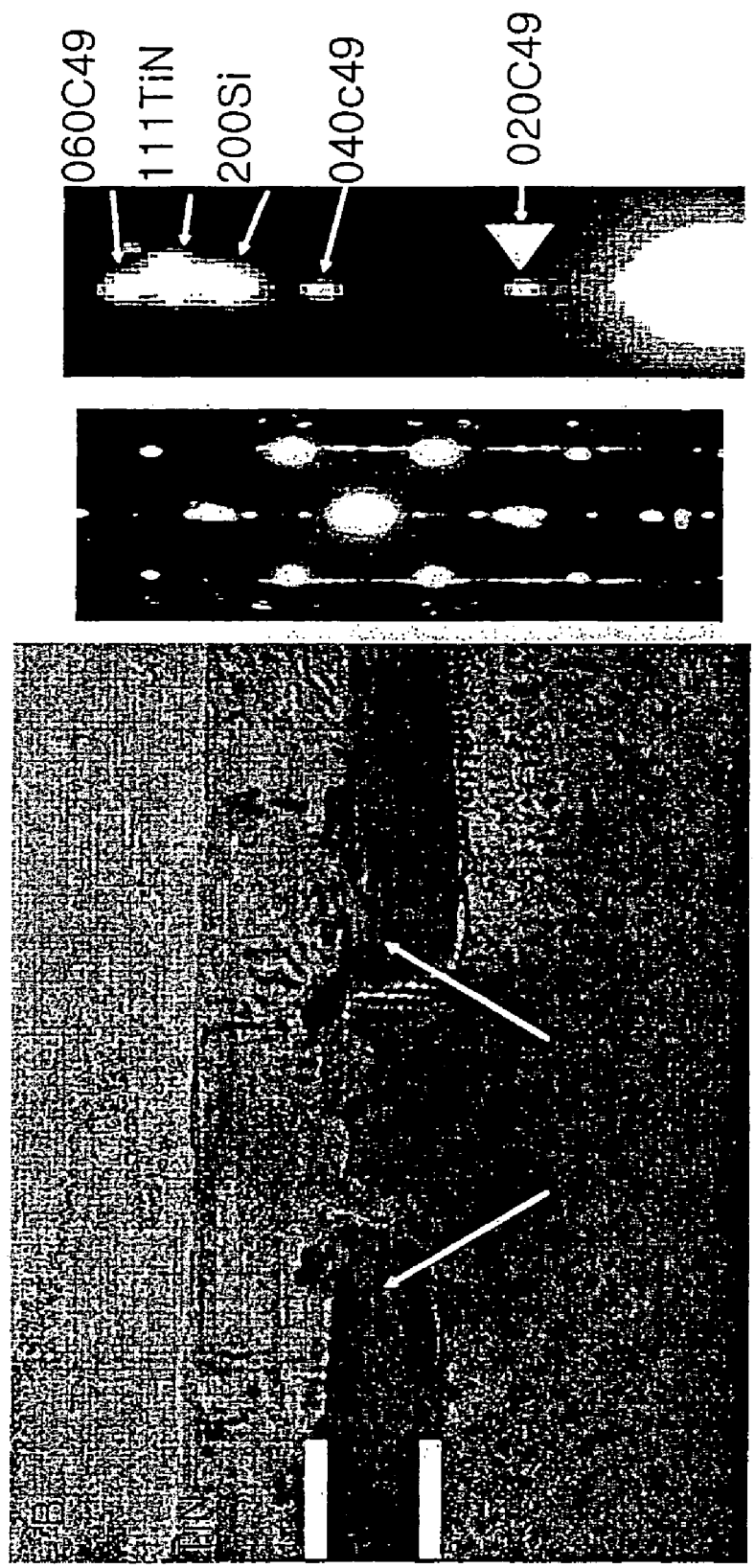
FIG. 7B is a TEM micrograph showing a fine structure of the phase of the $TiSi_2$ layer included in a sample to which the $N_2$ plasma treatment is applied for about 60 seconds.

FIG. 7A is a transmission electron microscopy (TEM) micrograph showing a fine structure of the phase of the TiSi$_2$ layer included in a sample to which the N$_2$ plasma treatment is not applied. FIG. 7B is a TEM micrograph showing a fine structure of the phase of the TiSi$_2$ layer included in a sample to which the N$_2$ plasma treatment is applied for about 60 seconds.

Referring to FIGS. 7A and 7B, in case of the absence of the N$_2$ plasma treatment, the TiSi$_2$ layer having the C54 phase and the titanium nitride layer (refer to the result of XRD) are formed with a thickness ranging from about 15 nm to about 30 nm and about 10 nm, respectively. Also, a grain boundary grooving phenomenon is observed. In contrast, for the case of performing the N$_2$ plasma treatment for about 60 seconds, the TiSi$_2$ layer is not formed consistently. Instead, islands are formed within the silicon substrate. Also, the titanium nitride layer has a thickness approximately twice the thickness of the titanium nitride layer formed without being applied with the N$_2$ plasma treatment. From an electron diffraction pattern, these islands are verified to be structures found in the C49 phase. Although some islands are tilted depending on types of the island, it is observed that a (060) plane of the TiSi$_2$ island has a parallel epitaxial growth relationship with a (020) plane of silicon. This result corresponds to the XRD analysis result as shown above. The orientation relationship between the silicon substrate and the TiSi$_2$ island is expressed as follows:

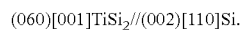

(060)[001]TiSi$_2$//(002)[110]Si.

Figure 8A:
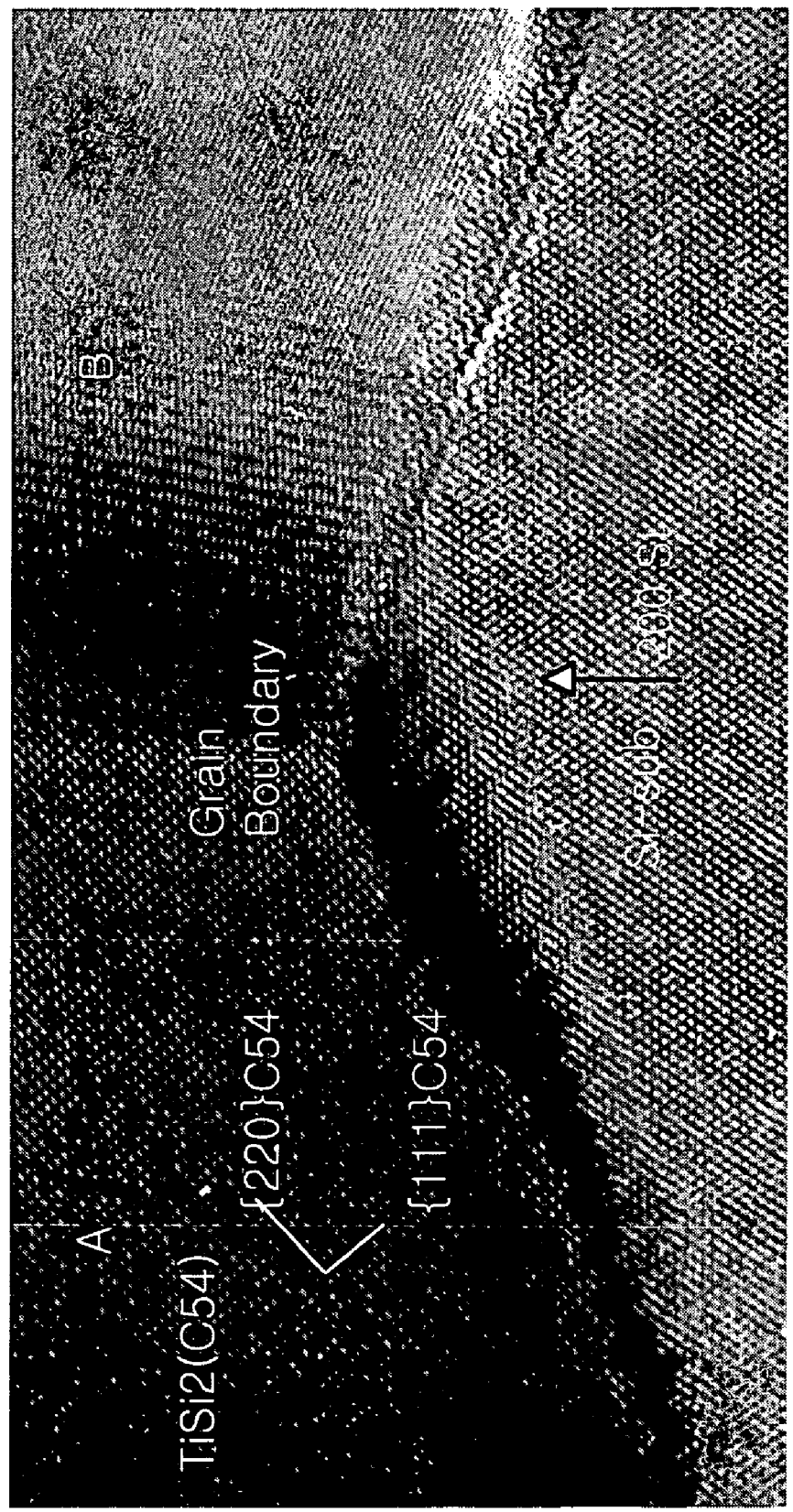
FIGS. 8A and 8B are micrographs of high resolution transmission electron microscopy (HRTEM) showing interfaces between a silicon substrate and a $TiSi_2$ layer.
Figure 8B:
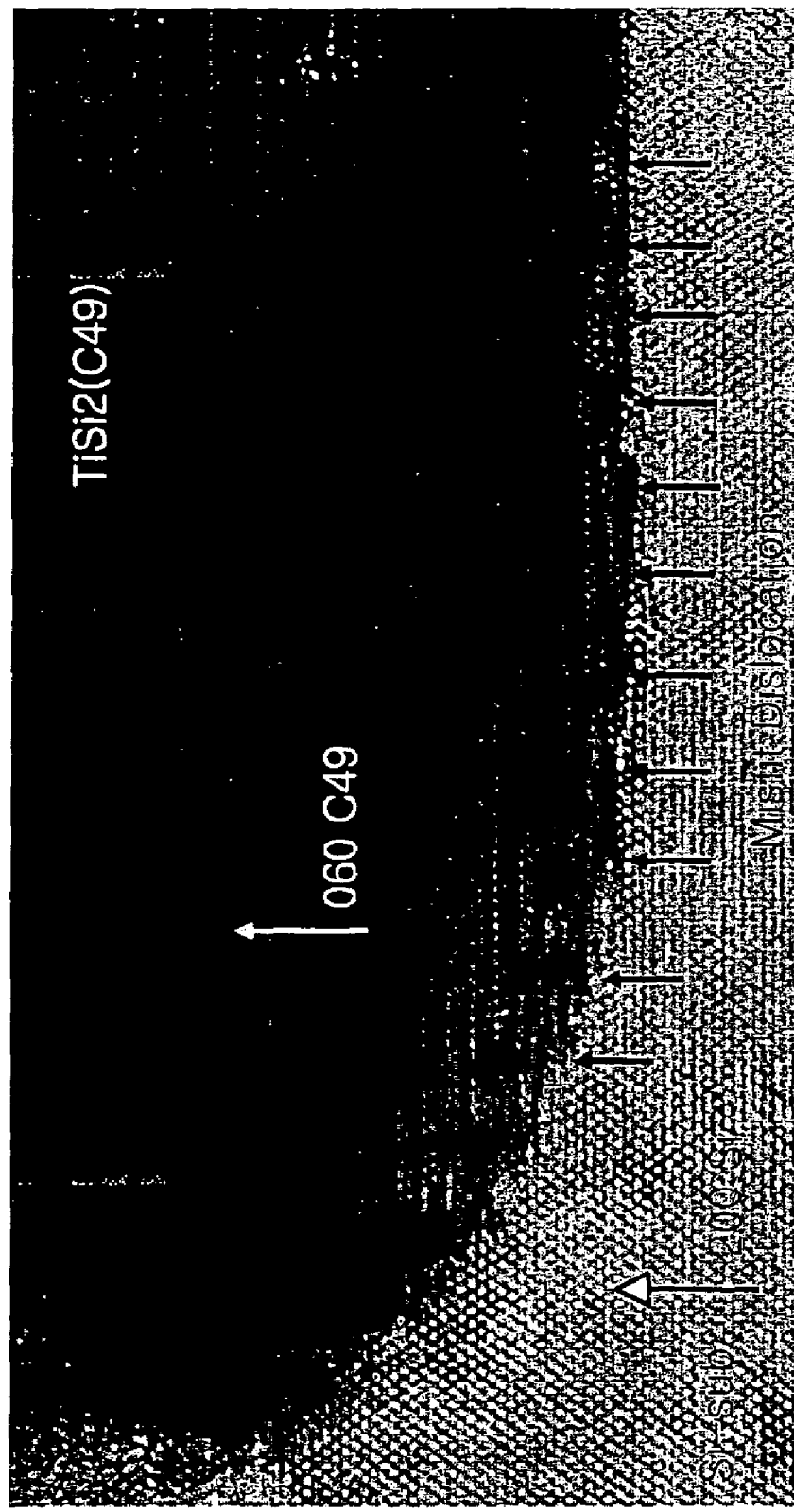

FIGS. 8A and 8B are micrographs of high resolution transmission electron microscopy (HRTEM) showing interfaces between the silicon substrate and the TiSi$_2$ layer. Particularly, FIG. 8A expresses a case of not performing the N$_2$ plasma treatment, while FIG. 8B expresses a case of performing the N$_2$ plasma treatment for about 60 seconds. As shown in FIG. 8A, if the TiSi$_2$ layer is formed under a random direction relationship, Moire fringe patterns are observed at the interface between the TiSi$_2$ layer and the silicon substrate. The Moire fringe patterns are shown in a region B. The Moire fringe is a contrast formed when lattices of the silicon substrate and the TiSi$_2$ layer are superimposed. In most of interfaces between the silicon substrate and the TiSi$_2$ layer, Moire fringe patterns are formed. However, in a region A, a contrast generated by strains in lattice is observed.

On the other hand, as shown in FIG. 8B, there is generated a periodic misfit interface dislocation with the application of the N$_2$ plasma treatment. This misfit interface dislocation is generated to reduce transformation energy of the interface caused by a difference in lattice constants of the silicon substrate and the TiSi$_2$ layer during the epitaxial growth.

Figure 9:
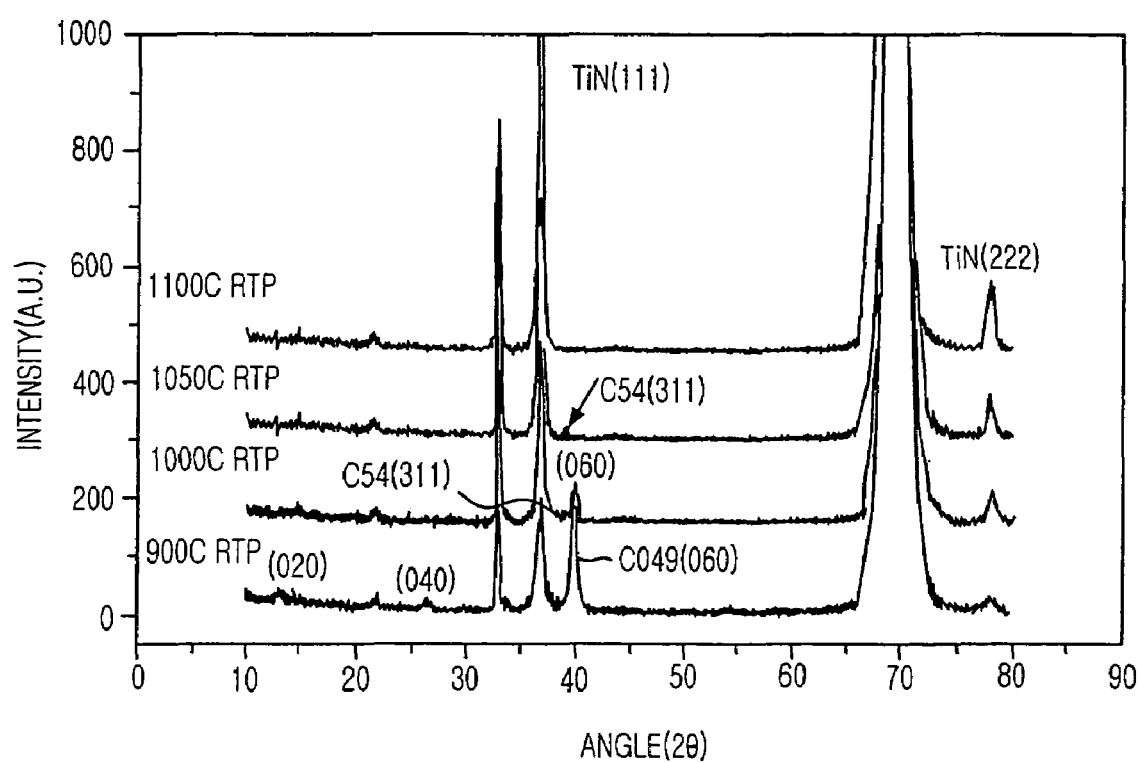
FIG. 9 is a graph showing XRD analysis showing changes in structure of the $TiSi_2$ layer according to a temperature for a rapid thermal process (RTP)

FIG. 9 is a graph showing XRD analysis showing changes in structure of the TiSi$_2$ layer according to a temperature for a RTP. The typical C49 phase has a random direction, but particularly has a priority direction mainly to a (131) plane and a (060) plane. Thus, it is not possible to directly observe a phase transformation to the C54 phase. However, for the C49 phase set by the N2 plasma treatment has a priority direction to the (060) plane. For this reason, the C49 phase will be shifted to the C54 phase by a subsequent thermal treatment, e.g. the RTP. In order to directly observe the phase transformation, the thermal treatment is performed at a temperature of about 900° C., about 1000° C., about 1050° C. and about 1100° C. for about 20 seconds. As shown in FIG. 9, a peak of the C54 phase is started to be observed at the sample treated at the RTP temperature of about 1000° C. At the RTP temperature of about 1050° C., the C49 phase disappears and transforms to the C54 phase and a phase of the TiN layer, and at the RTP temperature of about 1100° C., only the TiN layer remains since the C54 phase decomposes and becomes the TiN layer. Eventually, when the thermal treatment temperature about 1000° C. is reached, the C49 phase of the epitaxially grown $TiSi_2$ layer can exist without the phase transformation. Accordingly, it is possible to exclude chances of occurring agglomeration and grooving phenomena caused by the subsequent thermal treatment.

Figure 10:
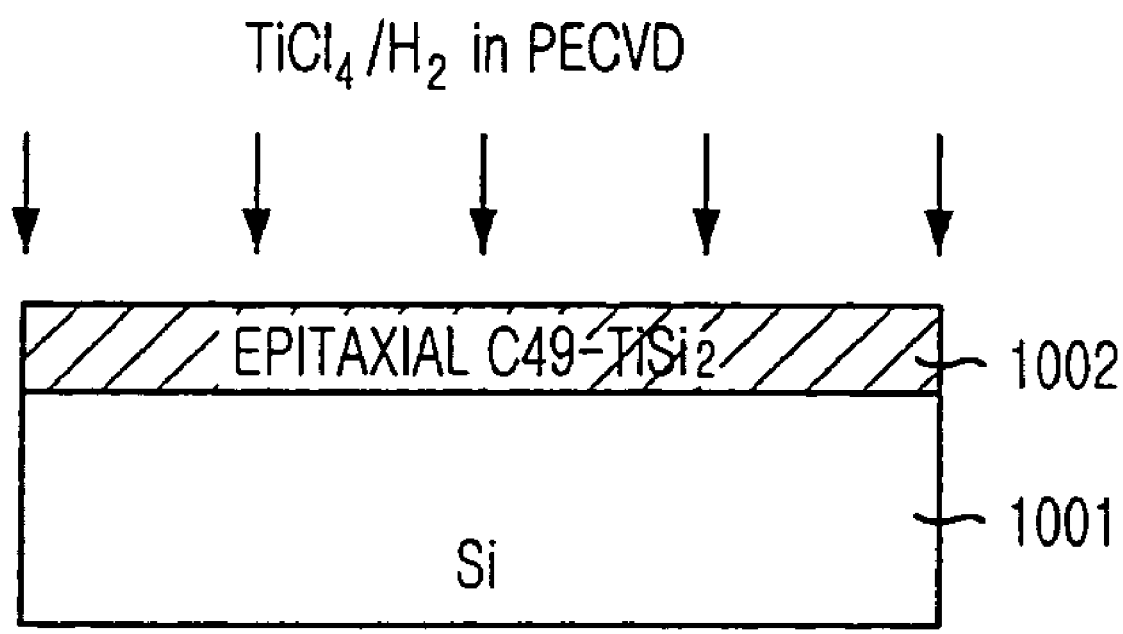
FIG. 10 is a cross-sectional view of an epitaxially grown C49-$TiSi_2$ layer formed by a chemical vapor deposition (CVD) technique in accordance with the present invention.

FIG. 10 is a cross-sectional view of an epitaxially grown $C49-TiSi_2$ layer formed by a chemical vapor deposition (CVD) technique. A method of forming the epitaxially grown $C49-TiSi_2$ layer by employing the CVD technique can be applied with the above described salicide formation process and the contact hole formation process. In this preferred embodiment of the present invention, the epitaxially grown $C49-TiSi_2$ layer is formed on a silicon substrate by employing a plasma enhanced chemical vapor deposition (PECVD) technique.

As shown, a silicon substrate or a silicon layer 1001 where predetermined processes are completed is provided, and the silicon substrate 1001 is cleaned through a wet cleaning process using BOE or HF or a dry cleaning process using NF3. Then, titanium tetrachloride ($TiCl_4$) gas and hydrogen ($H_2$) gas are flowed as a source gas of titanium and a reduction gas, respectively. The $TiCl_4$ gas and $H_2$ gas react with the silicon substrate 1001 to form an epitaxially grown $C49-TiSi_2$ layer 1002. The PECVD technique is carried out at a temperature ranging from about 550° C. to about 800° C. and a pressure ranging from about 1 Torr to about 20 Torr with supplied power ranging from about 200 W to about 800 W. Meanwhile, the above mentioned $TiCl_4/H_2$ gas can be used as a deposition gas, and silane ($SiH_4$) gas, which functions as a source gas of silicon and a reduction gas, can be added thereto. In other words, $TiCl_4/SiH_4/H_2$ gas or $TiCl_4/SiH_4$ gas can be used.

Figure 11A:
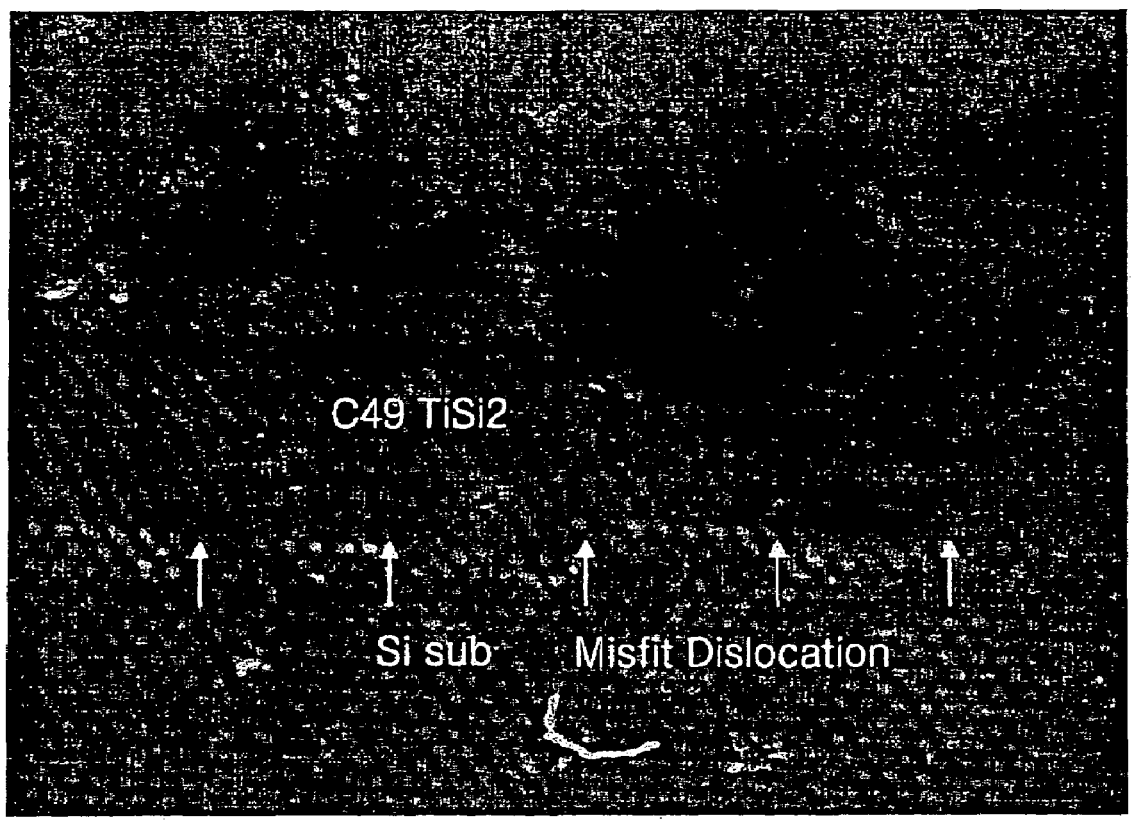
FIG. 11A is a micrograph of HRTEM showing the epitaxially grown C49-$TiSi_2$ layer formed by using the CVD technique carried out at a temperature of about 650° C. and a pressure of about 5 Torr.
Figure 11B:
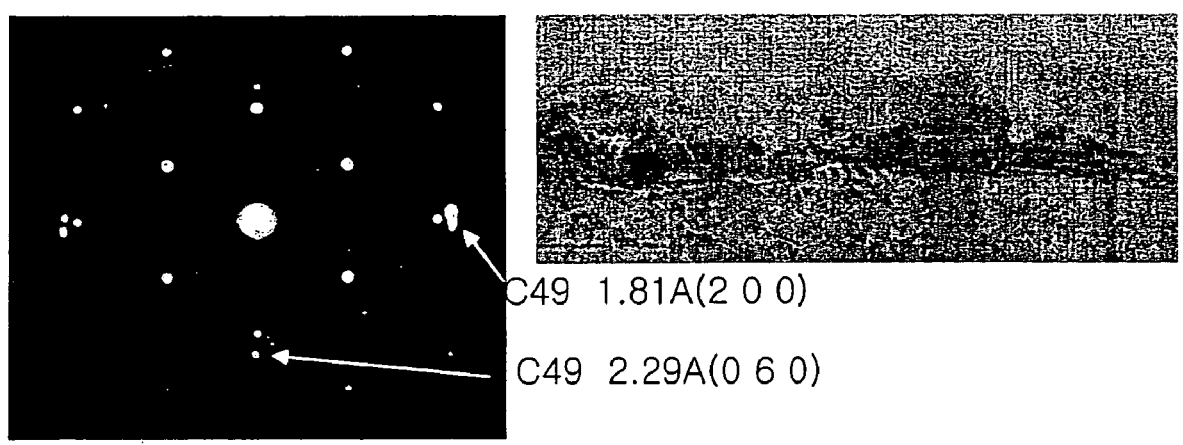
FIG. 11B is a micrograph of TEM showing the C49-$TiSi_2$ layer shown in FIG. 11A.

FIG. 11A is a micrograph of HRTEM showing the epitaxially grown $C49-TiSi_2$ layer formed by using the CVD technique carried out at a temperature of about 650° C. and a pressure of about 5 Torr. At this time, the $TiCl_4/H_2$ deposition gas is used in the CVD technique. FIG. 11B is a micrograph of TEM showing the same.

Referring to FIG. 11A, there are misfit dislocations generated in an interface between the silicon substrate and the $C49-TiSi_2$ layer. Also, a grain boundary does not exist in the $C49-TiSi_2$ layer. Hence, the interface between the silicon substrate and the $TiSi_2$ layer has minimum transformation energy since it is formed in a semi-matched manner. As a result, phase transformation of the epitaxially grown $C49-TiSi_2$ layer does not occur. In addition, the agglomeration and grooving phenomena do not occur.

Referring to FIG. 11B, at the same time of depositing the $TiSi_2$ layer with use of the CVD, the (060) plane has mostly the C49 phase. A partial portion of the $TiSi_2$ layer has a non-reacted Ti phase. However, this non-reacted Ti phase is transformed into the C49 phase by the subsequent thermal treatment. At this time, the pre-existing C49 phase is not transformed into the C54 phase.

Figure 12:
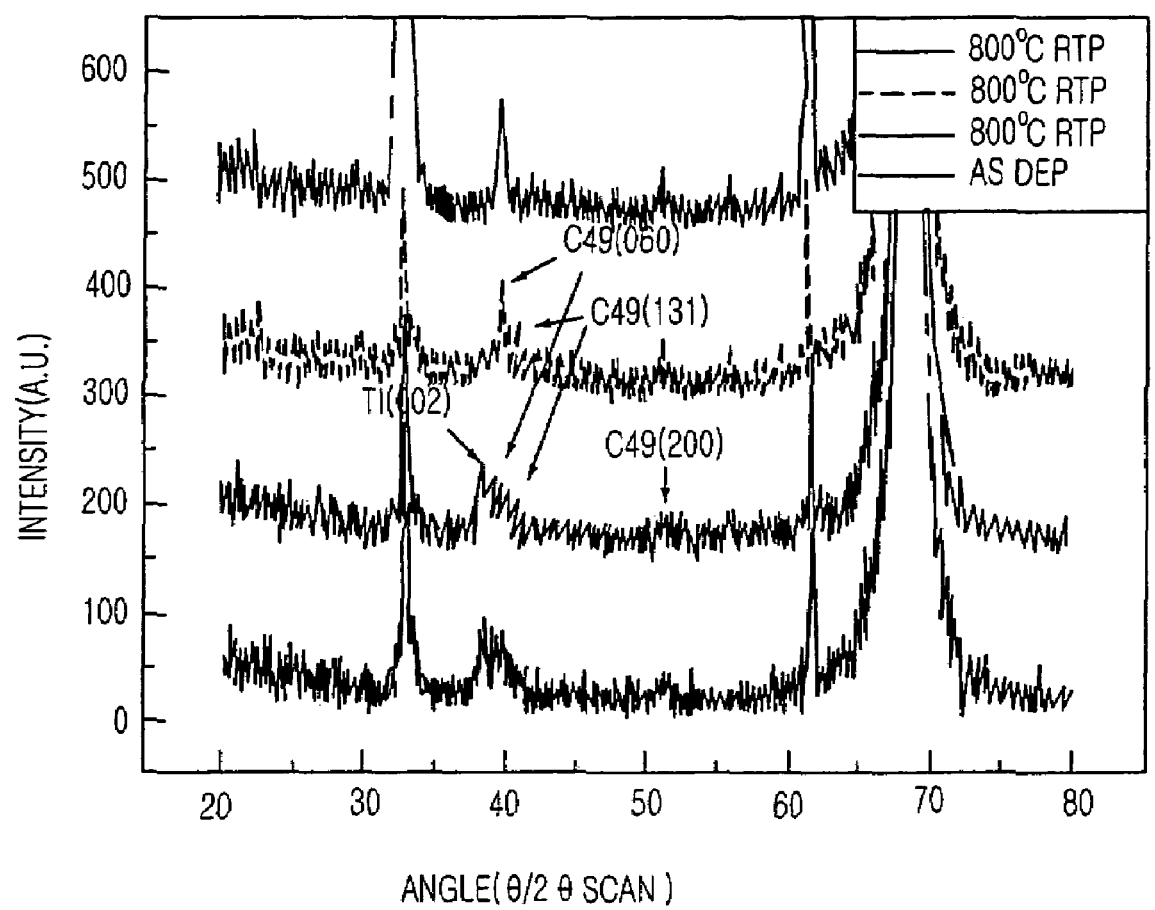
FIG. 12 is a graph showing structural changes of the epitaxially grown C49-$TiSi_2$ layer formed by the CVD technique in the course of performing the thermal treatment.

FIG. 12 is a graph showing structural changes of the epitaxially grown $C49-TiSi_2$ layer formed by the CVD technique in the course of performing the thermal treatment. Even at a temperature of about 800° C. for the thermal treatment, the epitaxially grown $C49-TiSi_2$ layer exists although the $C54-TiSi_2$ layer is not formed. In other words, the epitaxially grown $C49-TiSi_2$ layer formed by the CVD technique can exist stably up to about 800° C. during the thermal treatment.

FIGS. 13A to 13F are cross-sectional views illustrating a method for forming an epitaxially grown $C49-TiSi_2$ layer based on an atomic layer deposition (ALD) technique in accordance with a preferred embodiment of the present invention. The epitaxially grown $C49-TiSi_2$ layer formed by the ALD technique can be also applicable with the above described salicide formation process and contact hole formation process.

Figure 13A:
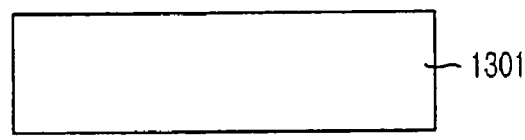
FIGS. 13A to 13F are cross-sectional views of an epitaxially grown C49-TiSi2 layer formed by an atomic layer deposition (ALD) technique in accordance with the present invention.
Figure 13B:
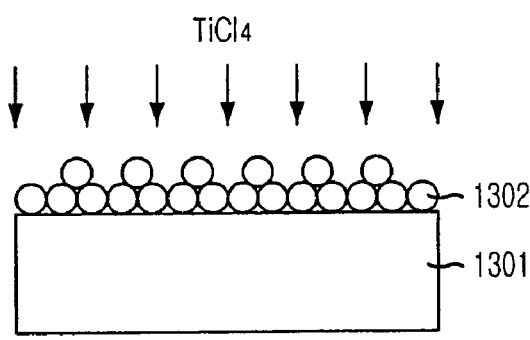
Figure 13C:
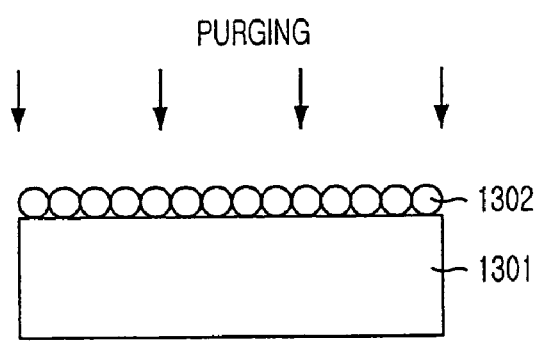

Referring to FIGS. 13A to 13C, a silicon substrate 1301 where predetermined processes are performed is loaded into a chamber (not shown) for an ALD. Then, as shown in FIG. 13B, $TiCl_4$ gas, which is a source gas of Ti, is flowed into the chamber to make $TiCl_4$ gas molecules 1302 adsorbed onto the silicon substrate 1301. Thereafter, a purging process proceeds to purge non-adsorbed and unstably adsorbed $TiCl_4$ molecules.

Figure 13D:
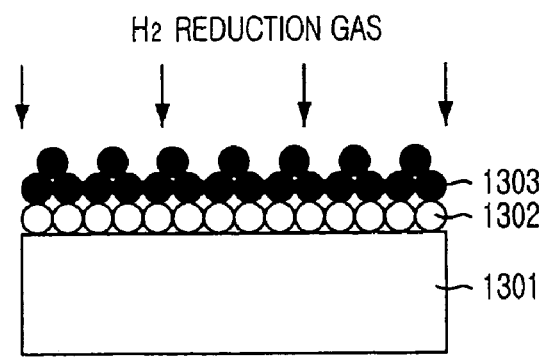
Figure 13E:
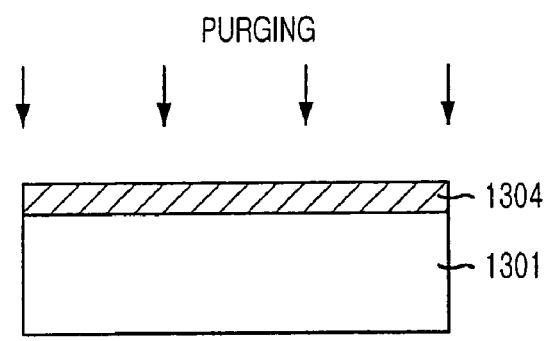

Referring to FIG. 13D, a reduction gas such as $H_2$ gas is flowed into the chamber, and $H_2$ gas molecules 1303 are adsorbed to make the adsorbed $TiCl_4$ gas molecules 1302 de-oxidated. After this de-oxidation, only a Ti layer remains and reacts with silicon from the silicon substrate 1301 to form a silicide layer 1304. Next, as shown in FIG. 13E, a purging process for purging the non-reacted reaction gas and by-products from the above reaction proceeds thereafter.

Figure 13F:
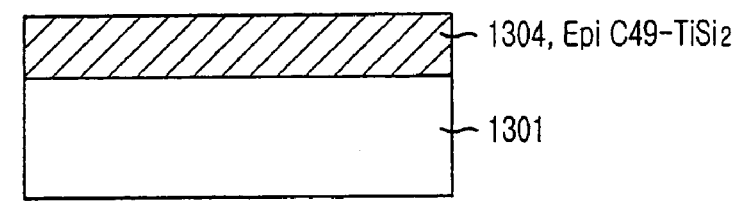

By performing repeatedly the steps illustrated from FIGS. 13A to 13E, it is possible to form the epitaxially grown $TiSi_2$ layer 1304 having the phase of C49 on the silicon substrate 1301. This epitaxially grown $C49-TiSi_2$ layer 1304 is shown in FIG. 13F.

The epitaxially grown $C49-TiSi_2$ layer 1304 by the ALD technique is formed at a temperature ranging from about 400° C. to about 700° C. and a pressure ranging from about 0.1 Torr to about 10 Torr. At this time, it is possible to use a plasma. Also, this preferred embodiment shows a case of using the $H_2$ gas as the reduction gas. However, such a gas containing silicon, e.g., $SiH_4$, can be also used as the reduction gas.

According to the present invention, the occurrences of agglomeration and grooving phenomena can be impeded by enabling the formation of the epitaxially grown $C49-TiSi_2$ layer having low interfacial energy, which results in no phase transformation of the $TiSi_2$ layer during the thermal treatment, on the silicon substrate or the silicon layer. This effect further provides another effect of reducing a contact resistance between the silicon layer and the $C49-TiSi_2$ layer and leakage currents.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:
   providing a silicon substrate on which predetermined processes are completed;
   performing a plasma treatment to a surface of the silicon substrate in a gaseous atmosphere including nitrogen for about 30 seconds to about 60 seconds at a temperature ranging from about 400° C. to about 450° C. and a pressure ranging from about 3 Torr to about 5 Torr along with power ranging from about 400 W to about 500 W.
   depositing a titanium layer on the silicon substrate by employing a physical vapor deposition (PVD) technique; and
   causing the silicon substrate to react with the deposited titanium layer through the use of a thermal treatment to form an epitaxially grown titanium silicide layer having a phase of C49.

2. The method as recited in claim 1, wherein the plasma treatment is carried out by employing one of a nitrogen ($N_2$) plasma treatment and an ammonium ($NH_3$) plasma treatment.

3. The method as recited in claim 1, wherein the PVD technique is an ion metal plasma (IMP) technique.

4. The method as recited in claim 1, wherein the thermal treatment performed in the atmosphere of nitrogen results in formation of a titanium nitride layer on a surface of the titanium layer.

5. The method as recited in claim 4, wherein the thermal treatment is one of a rapid thermal process (RTP) and a furnace annealing.

6. The method as recited in claim 4, wherein the thermal treatment includes the steps of:
   performing a first RTP at a temperature ranging from about 670° C. to about 850° C. for about 20 seconds to about 30 seconds; and
   performing a second RTP at a temperature ranging from about 850° C. to about 900° C. for about 20 seconds to about 30 seconds.

7. The method as recited in claim 1, wherein the thermal treatment is one of a rapid thermal process (RTP) and a furnace annealing.

8. The method as recited in claim 1, wherein the thermal treatment includes the steps of:
   performing a first RTP at a temperature ranging from about 670° C. to about 850° C. for about 20 seconds to about 30 seconds; and
   performing a second RTP at a temperature ranging from about 850° C. to about 900° C. for about 20 seconds to about 30 seconds.

9. The method as recited claim 1, further comprising the step of cleaning the silicon substrate prior to performing the plasma treatment.

10. The method as recited in claim 9, wherein the cleaning proceeds by employing one of a wet cleaning process using buffered oxide etchant (BOE) or hydrofluoric acid (HF) and a dry cleaning process using nitrogen trifluoride ($NF_3$).

11. A method for fabricating a semiconductor device, comprising the steps of:
    forming a device isolation layer for defining a field region and an active region in a silicon substrate;
    forming a transistor including source/drain diffusion regions in the active region of the silicon substrate;
    performing a plasma treatment to the silicon substrate disposed above each source/drain region in a gaseous atmosphere including nitrogen for about 30 seconds to about 60 seconds at a temperature ranging from about 400° C. to about 450° C. and a pressure ranging from about 3 Torr to about 5 Torr along with power ranging from about 400 W to about 500 W;
    depositing a titanium layer on the silicon substrate by employing a PVD technique;
    causing the silicon substrate to react with the deposited titanium layer through the use of a thermal treatment to form an epitaxially grown titanium silicide layer having a phase of C49; and
    removing the non-reacted titanium layer.

12. The method as recited in claim 11, wherein the plasma treatment proceeds by employing one of a $N_2$ plasma treatment and a $NH_3$ plasma treatment.

13. The method as recited in claim 11, wherein the thermal treatment includes the steps of:
    performing a first RTP at a temperature ranging from about 670° C. to about 850° C. for about 20 seconds to about 30 seconds; and
    performing a second RTP at a temperature ranging from about 850° C. to about 900° C. for about 20 seconds to about 30 seconds.

14. The method as recited in claim 11, further comprising the step of cleaning the silicon substrate in the source/drain diffusion regions prior to performing the plasma treatment by employing one of a wet cleaning process using BOE or HF and a dry cleaning process using $NF_3$.

* * * * *